US012633936B2

(12) United States Patent
Reimann

(10) Patent No.: US 12,633,936 B2
(45) Date of Patent: May 19, 2026

(54) METHOD FOR DETERMINING AN IQ OFFSET

(71) Applicant: LAMBDA:4 ENTWICKLUNGEN GMBH, Hamburg (DE)

(72) Inventor: Rönne Reimann, Hamburg (DE)

(73) Assignee: Lambda:4 Entwicklungen GmbH, Hamburg (DE)

( * ) Notice: Subject to any disclaimer, the term of this patent is extended or adjusted under 35 U.S.C. 154(b) by 347 days.

(21) Appl. No.: 18/262,504

(22) PCT Filed: Feb. 2, 2021

(86) PCT No.: PCT/EP2021/052445
§ 371 (c)(1),
(2) Date: Jul. 21, 2023

(87) PCT Pub. No.: WO2022/167059
PCT Pub. Date: Aug. 11, 2022

(65) Prior Publication Data
US 2024/0080037 A1      Mar. 7, 2024

(51) Int. Cl.
H03M 1/18          (2006.01)
H03M 1/60          (2006.01)
(Continued)

(52) U.S. Cl.
CPC .............. H03M 1/18 (2013.01); H03M 1/60 (2013.01); H03M 1/12 (2013.01); H03M 1/20 (2013.01)

(58) Field of Classification Search
CPC ............ H03M 1/18; H03M 1/60; H03M 1/20; H03M 1/12
See application file for complete search history.

(56) References Cited

U.S. PATENT DOCUMENTS 10,862,728 B1     12/2020   Rey
2012/0264391 A1 * 10/2012   Basaran ............... H03D 7/1433
                                                       455/341

FOREIGN PATENT DOCUMENTS

DE      102015109028 A1     12/2015

OTHER PUBLICATIONS

Wang Fengjie et al.: An effective DC offset calibration method combined with analog and digital circuits for direct conversion receivers 11, Oct. 10, 2019 (Oct. 10, 2019), pp. 1-6, XP055843194,DOI: 10.1587/elex.16.20190518 Located on Internet:URL:https://www. jstage.jst.go.jp/article/elex/16/19/16 16.20190518/ pdf/-char/en [located am-Sep. 21, 2021]—Abstract, Paragraph 1, Paragraph 2.1; Paragraph 3.1, Figs. 1,3; Table 1.

(Continued)

*Primary Examiner* — Joseph J Lauture
(74) *Attorney, Agent, or Firm* — Sand, Sebolt & Wernow Co., LPA

(57)          ABSTRACT

The invention relates to the process of determining an IQ offset, in particular at low intermediate frequencies, in a receiver for electromagnetic radiation, in particular for digital data transmission. The aim of the invention is to provide a simple manner for determining the IQ offset, in particular quickly, reliably, and/or at low intermediate frequencies. According to the invention, this is achieved in particular in that the analog-digital converter is separated from the receiving devices and is electrically connected to at least one resistor by means of a switch in order to determine the IQ offset. While the analog-digital converter is connected to the resistor and not to the receiving devices, digital IQ values are obtained by means of the analog-digital converter. The digital IQ values obtained while the converter is connected to the resistor are used to determine the IQ offset.

12 Claims, 1 Drawing Sheet

(51) Int. Cl.
*H03M 1/12*       (2006.01)
*H03M 1/20*       (2006.01)

(56)              References Cited

OTHER PUBLICATIONS

Kandel Laxima Niure et al: "Exploiting CSI-MIMO for Accurate and Efficient Device Identification", 2019 IEEE Global Communications Conference (GLOBECOM), IEEE, Dec. 9, 2019 (Dec. 9, 2019), pp. 1-6, XP033722896, DOI: 10.1109/GLOBECOM38437. 2019.9014191, Located am Feb. 25, 2020] Paragraph I.
Vladimir Brik et al: Wireless device identification with radiometric signatures 11, Proceedings of the 14th ACM International Conference on Mobile Computing and Networking, Mobicom 08, ACM Press, New York, New York, USA, Sep. 14, 2008 (Sep. 14, 2008), pp. 116-127, XP058391679,DOI: 10.1145/1409944.1409959ISBN: 978-1-60558-096-8, Paragraph 3.1.1; Figure 5.

* cited by examiner

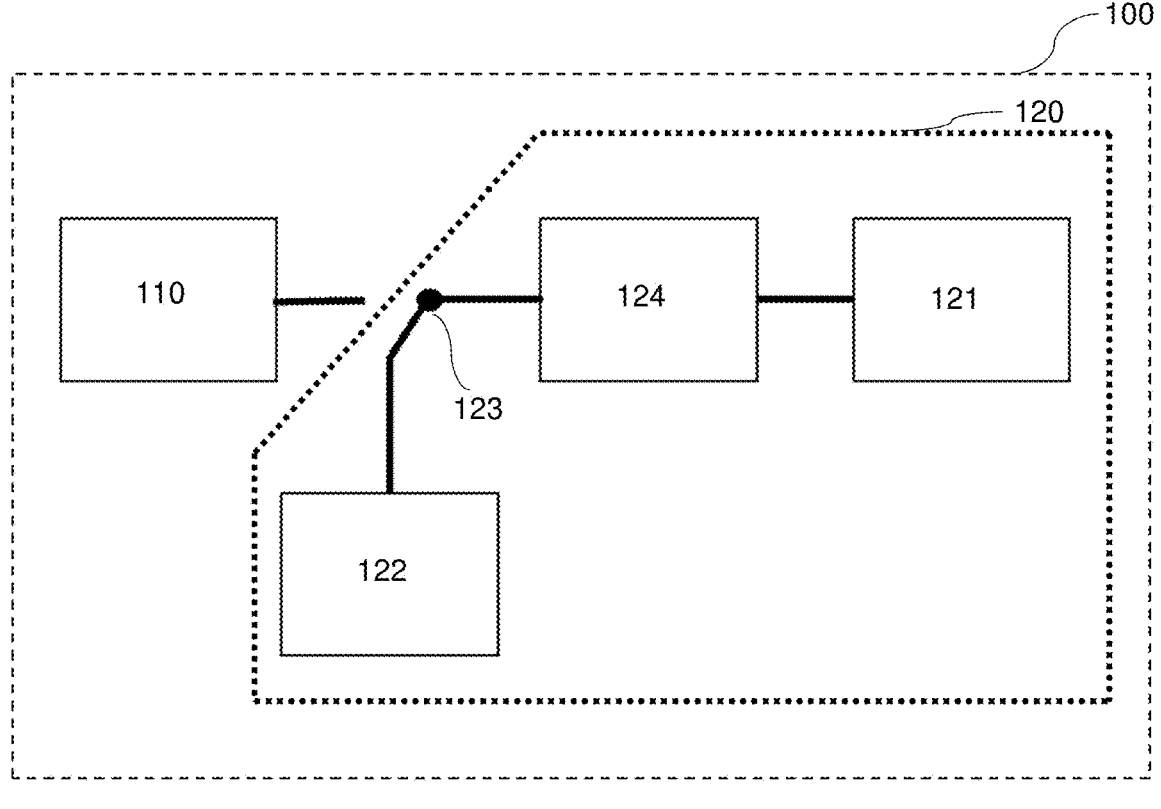

METHOD FOR DETERMINING AN IQ OFFSET

TECHNICAL FIELD

The present invention relates to the determination of the IQ offset, in particular at low intermediate frequencies, in a receiver for electromagnetic radiation, in particular for digital data transmission.

BACKGROUND ART

Determination of an offset of the receiving device in the IG space for reception and decoding is known from prior art, particularly when using symbol alphabets with more than two symbols. This is usually achieved by considering a plurality of measurements. This is problematic, however, with a given signal level and the use of low intermediate frequencies, or when any other interference is present in the input signal in the receiver, as it is inaccurate and/or requires long measurement times and/or requires further assumptions. Various mathematical tricks are also known to reduce the problem. Such methods are known, for example, from DE10 2015 109 028 B9 or U.S. Pat. No. 10,862,728 B1.

SUMMARY OF THE INVENTION

The task of the invention is to provide a simple way of determining the IQ offset, in particular quickly, reliably and/or at a low intermediate frequency, in particular while reducing possible further interference.

The invention relates in particular to devices, applications and/or methods in which at least two antennas are used for reception, and in which a switch arrangement or at least one changeover switch is arranged between an A/D converter and the antennas. In particular, a device for heterodyne mixing to an intermediate frequency, at least one filter and/or at least one amplifier is arranged between the switch arrangement and/or the changeover switch.

The invention relates in particular to devices, applications and/or methods in which digital data transmission is used, in particular by means of the transmission of chips and/or symbols, in particular signals of a digital data transmission system, in particular a chip-synchronised and/or symbol-synchronised digital data transmission system.

Here a plurality of symbols and/or chips with a first symbol or chip rate are transmitted encoded in at least one first analogue data signal from the first object to the second object by means of the devices, the applications and/or the method.

The task is solved in particular by methods for determining an IQ offset of an analogue-digital converter arrangement in a receiver for receiving and decoding electromagnetically transmitted information, in particular for receiving and decoding symbol-encoded transmitted digital data, said analogue-digital converter arrangement having at least one switch and at least one analogue-digital converter and at least one, in particular at least also ohmic, resistor. Here digital IQ values of at least one electrical signal are obtained by means of the analogue-digital converter, whereby the at least one electrical signal is fed to the analogue-digital converter of at least one receiving device, in particular antenna, in particular successively from at least two receiving devices, in particular antennas, by means of the at least one switch. This enables the analogue-digital converter (also AD converter) to determine IQ values of the electrical signal, from which the digital information contained can be extracted. The invention is characterised in that, in order to determine the IQ offset by means of the at least one switch, the analogue-digital converter is disconnected from the receiving device(s) and connected electrically to the at least one resistor. While the analogue-digital converter is connected to the resistor and in particular not to the receiving device(s), digital IQ values are obtained by means of the analogue-digital converter. Thus, by means of the AD converter, in particular the signal received and processed via the resistor and the device electrically arranged between the resistor and the AD converter is sampled, in particular at least one I and one Q value, preferably at least ten each, are obtained here. The digital IQ values obtained while the converter is connected to the resistor are used to determine the IQ offset. In particular, the IQ offset is determined from the digital IQ values obtained during the connection to the resistor.

The task is also solved by using a resistor, in particular at least also an ohmic resistor, as a receiving means and/or as a means for generating an electrical signal for determining an IQ offset of an analogue-digital converter arrangement.

The task is also solved by a receiver, in particular a superheterodyne receiver, for receiving and decoding electromagnetically transmitted information, in particular for receiving and decoding symbol-encoded transmitted digital data, said analogue-digital converter arrangement having at least one switch and at least one analogue-digital converter and at least one, in particular at least also ohmic, resistor, said receiver being configured to obtain digital IQ values of at least one electrical signal by means of the analogue-digital converter, said receiver being configured to feed the at least one electrical signal to the analogue-digital converter from at least one receiving device, in particular successively from at least two receiving devices, by means of the at least one switch. The receiver is thereby characterised in that it is configured to disconnect the analogue-digital converter from the receiving devices and to electrically connect it to the at least one resistor in order to determine the IQ offset by means of the at least one switch, and to obtain digital data by means of the analogue-digital converter while the analogue-digital converter is connected to the resistor. The task is also solved by a data transmission system comprising at least one transmitter and at least one receiver, in particular two transceivers, in which at least one receiver according to the invention is included. The receiver according to the invention can be included as a receiver or as part of a transceiver.

The inventor has surprisingly discovered that by using the resistor instead of an antenna as receiver, a reliable IQ offset can be determined in a short time. This reduces the complexity of the determination, reduces the time required and makes it possible to repeatedly determine new IQ offsets to also increase accuracy over time.

It is a particular advantage if the receiver is part of a transmission system and/or operates according to a transmission standard and/or the application or method is carried out by means of a transmission system and/or standard. In particular, the transmission system is a Bluetooth system and/or the transmission standard is a Bluetooth standard. In particular, the transmission system is a digital data transmission system, in particular operating with QAM. In particular, the transmission system and/or transmission standard uses chips and/or symbols, in particular signals of a digital, in particular QAM, ASK, FSK, GFSK, PSK, QPSK, QAM, APSK and/or OFDM based, data transmission system and/or standard, in particular a chip-synchronised and/or symbol-synchronised digital data transmission system and/or standard. The transceivers are preferably configured to transmit a plurality of symbols and/or chips with a first symbol or chip rate encoded in at least one first analogue data signal (from) between the transceivers.

In a particularly advantageous embodiment, the method is used to determine the IQ offset for the reception of a clear carrier or a continuous wave, as at least optionally provided in recent Bluetooth standard versions and draft versions.

In particular, the electrical signal contains chips and/or symbols, in particular signals of a digital, in particular QAM, ASK, FSK, GFSK, PSK, QPSK, QAM, APSK and/or OFDM based, data transmission system, in particular a chip-synchronised and/or symbol-synchronised digital data transmission system. In particular, the method is a method for, in particular wireless, transmission of digital data, in particular encoded in an analogue signal. In particular, the system is a system for, in particular wireless, transmission of digital data, in particular encoded in an analogue signal.

In particular, the receiver and/or the system, in particular each transceiver, is configured to carry out a method and/or application according to the invention. In particular, the receiver, in particular each transceiver includes a calculation device for calculating the IQ offset from the IQ values obtained. In particular, the receiver, in particular each transceiver, comprises a control device which is configured to control the at least one switch, the calculation device and/or the AD converter to perform the method according to the invention.

In particular, the system, the transmission standard and/or the transmission system uses a symbol alphabet with more than two, in particular more than four, symbols and/or with symbols in which more than two, in particular more than four, bits can be encoded and/or are encoded and/or the receiver is configured to decode a symbol alphabet with more than two, in particular more than four, symbols and/or with symbols in which more than two, in particular more than four, bits can be encoded and/or are encoded.

The separation can also be effected by electrical switching elements which do not lead to a complete galvanic separation but only to a significant increase in the resistance, in particular by a factor of at least 100.

In particular, a switching device is arranged or used in such a way that, on the one hand, at least one receiving device, in particular at least two receiving devices, in particular antennas, in particular without amplifier and/or signal conditioning unit, and the resistor can each be selectively connected to, on the other hand, a signal conditioning unit which supplies the conditioned signal to the inputs of the A/D converter. The signal conditioning unit includes in particular at least one filter or filtering and/or at least one amplifier or amplification and/or one superheterodyne device and/or the superimposition. It is in particular part of the analogue-digital converter arrangement. By means of the superheterodyne device and/or the superimposition, the signal supplied via the switch is mixed in particular with a locally generated signal and converted in particular to a lower intermediate frequency. The superimposition device is configured for this purpose. For this purpose it contains in particular a local oscillator. The filter is in particular a bandpass filter. In particular, the signal is fed from the switch via the superheterodyne device and then the filter to the AD converter.

The offset is determined in particular so that it represents an I and a Q value by which the digital IQ values obtained during the connection of the analogue-digital converter to the resistor must be shifted so that they are centred around the zero point. The centring can thereby include a weighting of all the and/or the individual digital IQ values obtained, but preferably it is the unweighted mean of the digital IQ values obtained. Preferably, this should be zero after application of the offset, or the offset should be opposed to the mean value.

In a particularly advantageous embodiment, a new IQ offset is determined after a maximum of 10 ms. In this way, fluctuations can be detected and any resulting errors can be avoided.

In an advantageous embodiment, different IQ offsets are determined for different frequencies, in particular intermediate frequencies, different temperatures and/or different amplification factors; for this purpose, the method is carried out in particular once for each of the frequencies, temperatures and/or amplification factors using the respective frequency, temperature and/or amplification factor.

The IQ values are in particular in-phase values and quadrature values.

In particular, the at least one AD converter contains at least one AD converter for the in-phase value and at least one for the quadrature value.

In an advantageous embodiment, the IQ offset is determined by selecting the IQ offset such that digital IQ values obtained during the connection to the resistor and/or a subset of the obtained digital IQ values lie symmetrically around the zero point by applying the IQ offset. The receiver or transceiver is advantageously configured to do this.

In an advantageous embodiment, subsets of data are obtained from the digital I values obtained during the connection to the resistor, and a subset IQ offset is determined for a majority of the subsets of data in each case. In particular, an indicator for the quality of the IQ offset and/or at least one subset IQ offset is obtained by means of the subset IQ offsets. This can be determined by the differences and/or a metric of the subset IQ offsets, for example their variation and/or variance. The receiver or transceiver is advantageously configured to do this. This makes it possible to determine whether the determination should be improved by further IQ values and/or whether the determination should be repeated.

In a particularly advantageous embodiment, subsets of data are obtained from the digital IQ values obtained during the connection to the resistor, and a subset IQ offset is determined for each of a plurality of the subsets of data, said IQ offset being determined from the or from a subset of the subset IQ offsets. This can be done, for example, by averaging. The selection of the subset of the subset IQ offsets may be based, for example, on deviations of a mean value or other metrics, such as the variation within the corresponding data subset. The receiver or transceiver is advantageously configured to do this.

In this way, the determination can be improved, for example by not taking into account IQ values for which there is a particularly strong interference.

In a particularly advantageous embodiment, the receiver, in particular the analogue-digital converter arrangement, includes a device for mixing to an intermediate frequency and/or the receiver uses an intermediate frequency, whereby said intermediate frequency is selected such that the time used to measure the digital IQ values obtained during the connection to the resistor for determination of the IQ offset is shorter than the reciprocal of the intermediate frequency multiplied by five, in particular by three, and/or the intermediate frequency is lower than 100 kHz, in particular lower than 10 KHz. The receiver or transceiver is advantageously configured to do this. Particularly with such combinations of intermediate frequency and measurement time, the advantages of the invention become particularly apparent, since the disadvantages of the prior art result in particularly strong interference in these constellations.

In particular, the method is carried out for determining an IQ offset for the reception of signals for determining the angle of departure (AoD) or angle of arrival (AoA) and/or for phase-based distance measurement. Here, the advantages of the invention come particularly to bear, since a low intermediate frequency of less than 100 kHz, in particular less than 10 kHz, is particularly advantageous for this purpose in order to minimise errors in the determination/measurement caused by time inaccuracies. In this respect, the benefit of the invention is particularly large since the measurement time and/or measurement error can be significantly reduced. In particular, the method is thus part of a method for determining the angle of departure (AoD), angle of arrival (AoA) and/or for phase-based distance measurement. In particular, the application is thus an application for determining the angle of departure (AoD), angle of arrival (AoA) and/or for phase-based distance measurement. In particular, the receiver and/or the system is configured for determining the angle of departure (AoD), angle of arrival (AoA) and/or for phase-based distance measurement.

In particular, the intermediate frequency is a low intermediate frequency, which is especially the case if no or only less than three complete waves are included over the measurement period for determining the IQ offset. This is because the fewer complete waves are included, the greater the error of the IQ offset due to the incomplete waves included in the IQ values. This can be reduced, as the inventor has recognised, by connecting the A/D converter to a resistor to determine the IQ offset.

In an advantageous embodiment, the analogue-digital converter arrangement comprises at least one device for heterodyne mixing of the signal supplied by means of the switch before it reaches the analogue-digital converter, and the electrical signal supplied by means of the switch is converted to an intermediate frequency by means of the device for heterodyne mixing. The receiver or transceiver is advantageously configured to do this. This allows the subsequent circuitry to be simplified and the work for digitisation and decoding to be reduced.

A heterodyne receiver is in particular characterised in that it comprises, as a device for heterodyne mixing, means for converting the variable or constant input frequency to an, in particular lower and in particular constant, intermediate frequency, in particular between switch and AD converter.

The method and/or the application includes in particular the conversion of the variable or constant input frequency to an, in particular lower and in particular constant, intermediate frequency, in particular between switch and AD converter.

The at least one switch is advantageously used to electrically connect and disconnect the analogue-digital converter of the analogue-digital converter arrangement and/or the analogue-digital transceiver arrangement to and from the resistor and/or to connect and disconnect it to and from at least one receiver device. The receiver or transceiver is advantageously configured to do this.

The receiving device(s) advantageously comprise(s) one or more antenna(s). In particular, the antenna signal is fed to the switch without amplification. The receiver or transceiver is advantageously configured to do this. This allows the reliability of the method to be increased. Particularly preferably, no amplifier, in particular no LNA, is arranged and/or used between AD converter and antenna, in particular not between switch and antenna and/or receiving device.

Preferably, the receiver is configured, in particular exclusively, to use the digital IQ values obtained during the connection to the resistor to determine the IQ offset.

In a particularly advantageous embodiment, the resistor is an ohmic resistor and/or the resistor has a resistance in the range of 30 to 150 ohms, in particular adapted to the RF circuit of the receiver used, in particular of 50 ohms.

BRIEF DESCRIPTION OF THE DRAWINGS

FIG. 1 (FIG. 1) shows a a schematic block diagram of an embodiment of an receiver according to the invention.

DETAILED DESCRIPTION

Within the embodiment shown, receiver 100 comprises a receiving device 110, usually in form of at least one antenna, and an analog-digital converter arrangement 120. The analog-digital converter arrangement 120 comprises an analog-digital converter 121, a resistor 122, a switch 123 and an amplifier 124 with said amplifier being an optional component. The switch is configured to connect and disconnect the resistor 122 and receiving device 110 respectively to and from the analog-digital converter 121.

When the analog-digital converter 121 is connected to the receiving device 110, electronic signals received by the receiving device 110 may be fed to the analog-digital converter 121 for obtaining digital IQ values.

The analog-digital converter 121 may be disconnected from the receiving device 110 and connected to the resistor 122 by means of the switch 123 (as is shown in FIG. 1). Then, the analog-digital converter 121 may obtain digital IQ data measured while being connected to the resistor 122 to determine an IQ offset of the receiver 100 based on the digital IQ data obtained.

Further, the amplifier 124 may be used to amplify signals before being fed into the analog-digital converter 121. As the amplifier 124 is positioned between the switch 123 and the analog-digital converter 121, and thus, ultimately, between the analog-digital converter 121 and the resistor 122 and receiving device 110 respectively, the IQ offset determined still resembles the IQ offset present in each of the signals fed into the analog-digital converter 121.

The IQ offset determined may then be used to correct digital IQ values obtained for signals received by the receiving device 110 and fed into the analog-digital converter 121 and may respectively be used for phase-based measurements, e.g., phase-based distance determinations or measurements of angel of arrival or angle of departure.

The invention claimed is:

1. A method for determining an IQ offset of an analogue-digital converter arrangement coupled with at least one receiving device of a receiver for receiving and decoding electromagnetically transmitted information, wherein the analogue-digital converter arrangement comprises a switch, an analogue-digital converter and a resistor, wherein at least one amplifier is arranged between the switch and the analogue-digital converter or no amplifier is arranged between the switch and the at least one receiving device; the method comprising the steps of:

disconnecting, via the switch, the analogue-digital converter from the at least one receiving device of the receiver;

connecting the analogue-digital converter to the resistor;

obtaining, while the analogue-digital converter is connected to the resistor, digital IQ data via the analogue-digital converter; and determining the IQ offset using digital values obtained while the analogue-digital converter is connected to the resistor.

2. The method according to claim 1, wherein the IQ offset is determined by selecting the IQ offset such that the digital IQ data or a subset of the digital IQ data obtained while the analogue-digital converter is connected to the resistor is distributed symmetrically around zero when applying the IQ offset.

3. The method according to claim 1, wherein subsets of data are obtained from the digital IQ data obtained while the analogue-digital converter is connected to the resistor and subset IQ offsets are determined respectively for a plurality of the subsets of data, and wherein an indicator for the quality of the IQ offset or at least one subset of the IQ offsets is determined using the subset IQ offsets.

4. The method according to claim 1, wherein subsets of data are obtained from the digital IQ data obtained while the analogue-digital converter is connected to the resistor and subset IQ offsets are determined respectively for a plurality of the subsets of data, wherein the IQ offset is determined from the subset IQ offsets or from a subset of the subset IQ offsets.

5. The method according to claim 1, wherein the receiver or the analogue-digital converter arrangement includes a device for mixing to an intermediate frequency or the receiver uses an intermediate frequency, said intermediate frequency being selected such that a time used to measure the digital IQ data obtained during the connection to the resistor for determination of the IQ offset is shorter than a reciprocal of the intermediate frequency multiplied by five, or the intermediate frequency is lower than 100 kHz.

6. The method according to claim 1, wherein the analogue-digital converter arrangement comprises at least one device for heterodyne mixing of a signal supplied via the switch and before the signal reaches the analogue-digital converter, wherein the signal supplied via the switch is converted to an intermediate frequency via the device for heterodyne mixing.

7. The method according to claim 1, wherein, for determining an angle of departure (AoD), an angle of arrival (AoA) or for a phase-based distance measurement, at least one radio signal is transmitted from a transmitter to the receiver and at least one phase measurement is carried out on the at least one radio signal received at the receiver, wherein, based on the at least one phase measurement, the angle of departure of the at least one radio signal at the transmitter (AoD), the angle of arrival of the radio signal at the receiver (AoA) or a distance between the transmitter and the receiver is determined, wherein the at least one phase measurement is carried out using the IQ offset determined.

8. The method according to claim 1, further comprising the step of, during the analogue-digital converter being connected to the at least one receiving device via the switch, obtaining, via the analogue-digital converter, digital IQ values of at least one electrical signal fed to the analogue-digital converter from the at least one receiving device.

9. The method according to claim 8, wherein the step of obtaining digital IQ values obtained during the analogue-digital converter being connected to the at least one receiving device is performed i) prior to disconnecting the analogue-digital converter from the at least one receiving device; or ii) after determining the IQ offset, wherein the analogue-digital converter is reconnected to the at least one receiving device for obtaining the digital values.

10. The method according to claim 8, wherein digital IQ values obtained during the analogue-digital converter being connected to the at least one receiving device are corrected using the IQ offset.

11. A receiver for receiving and decoding electromagnetically transmitted information comprising an analogue-digital converter arrangement and at least one receiving device, wherein the analogue-digital converter arrangement comprises at least one switch, at least one analogue-digital converter and at least one resistor, wherein the receiver is configured to obtain digital IQ values from at least one electrical signal via the analogue-digital converter and for the at least one electrical signal to be fed to the analogue-digital converter from the at least one receiving device, via the at least one switch, wherein the receiver is configured, via the at least one switch, to disconnect the analogue-digital converter from the at least one receiving device and to connect the analogue-digital converter electrically to the at least one resistor and to obtain IQ digital data via the analogue-digital converter while the analogue-digital converter is connected to the at least one resistor, wherein the receiver is configured to use the digital IQ data obtained during the analogue-digital converter being connected to the at least one resistor to determine an IQ offset, wherein no amplifier is arranged between the at least one switch and an antenna or no amplifier is arranged between the at least one switch and the at least one receiving device, or wherein at least one amplifier is arranged between the at least one switch and the analogue-digital converter.

12. A data transmission system comprising at least one transmitter and the receiver of claim 11.

\* \* \* \* \*